(12) United States Patent
Fuchs et al.

(10) Patent No.: US 8,692,207 B2
(45) Date of Patent: Apr. 8, 2014

(54) METHOD TO PRODUCE A SCINTILLATOR-PHOTOSENSOR SANDWICH, SCINTILLATOR-PHOTOSENSOR SANDWICH, AND RADIATION DETECTOR

(75) Inventors: Manfred Fuchs, Nuremberg (DE);
Klaus Lowack, Uttenreuth (DE);
Adelbert Preissler, Uttenreuth (DE)

(73) Assignee: Siemens Aktiengesellschaft, Munich (DE)

( * ) Notice: Subject to any disclaimer, the term of this patent is extended or adjusted under 35 U.S.C. 154(b) by 195 days.

(21) Appl. No.: 13/302,341

(22) Filed: Nov. 22, 2011

(65) Prior Publication Data
US 2012/0132812 A1   May 31, 2012

(30) Foreign Application Priority Data

Nov. 26, 2010 (DE) .................. 10 2010 062 035

(51) Int. Cl.
*H01L 21/50* (2006.01)
(52) U.S. Cl.
USPC .................................. 250/370.11

(58) Field of Classification Search
CPC .......................... B29C 65/7855; B29C 65/54
USPC ...................... 156/249; 250/370.11
See application file for complete search history.

(56) References Cited

U.S. PATENT DOCUMENTS

2003/0155515 A1 *  8/2003  Moy et al. ............... 250/361 R
2008/0206917 A1     8/2008  Dast

* cited by examiner

*Primary Examiner* — Constantine Hannaher
(74) *Attorney, Agent, or Firm* — Schiff Hardin LLP

(57) ABSTRACT

A scintillator-photosensor sandwich is generated by gluing a first support frame onto an adhesive layer (covered with a protective film on the side facing the adhesive layer, the first frame having a size that (in terms of area) surrounds the scintillator-photosensor sandwich to be produced. The first support frame is placed onto a flat base that supports a first function layer (either a scintillator layer or a photosensor layer). The adhesive layer supported on the first support frame and the first function layer are laminarly assembled. The protective film is removed from the adhesive layer and a second function layer (the other of the scintillator layer or the photosensor layer not used as the first function layer) is assembled with the first function layer with the interposed adhesive layer.

17 Claims, 3 Drawing Sheets

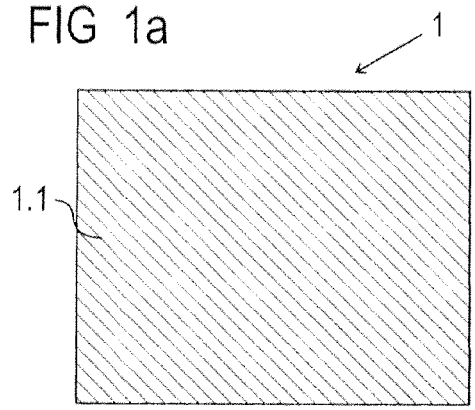
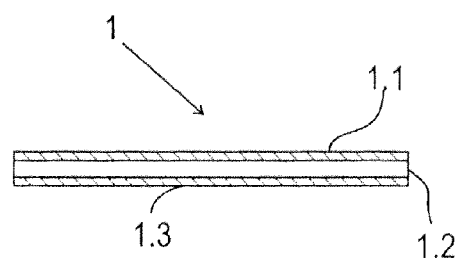
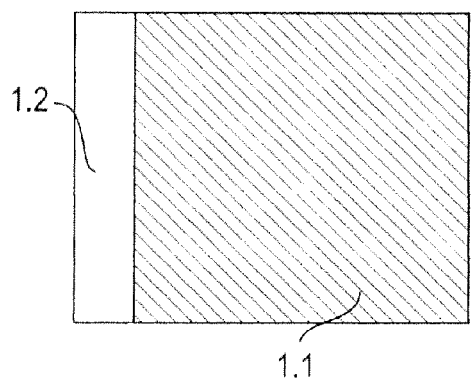
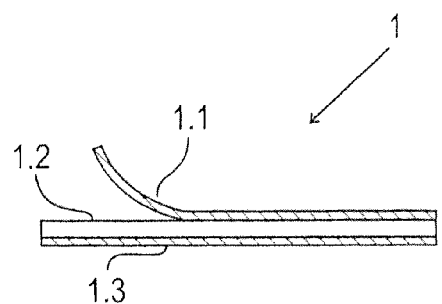
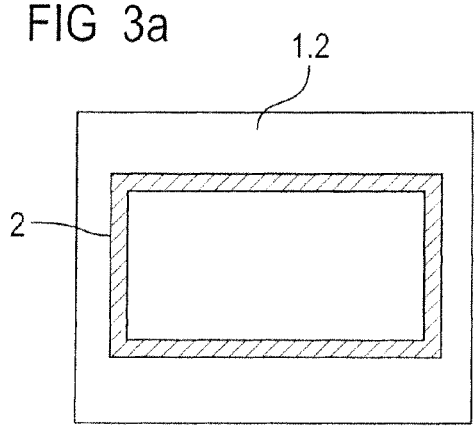
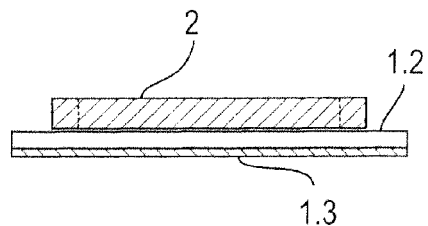

METHOD TO PRODUCE A SCINTILLATOR-PHOTOSENSOR SANDWICH, SCINTILLATOR-PHOTOSENSOR SANDWICH, AND RADIATION DETECTOR

BACKGROUND OF THE INVENTION

1. Field of the Invention

The invention concerns a method to produce a scintillator-photosensor sandwich, a scintillator-photosensor sandwich, and a radiation detector with a photosensor sandwich, wherein the scintillator-photosensor sandwich is produce by gluing a scintillator layer with a photosensor layer.

2. Description of the Prior Art

In the manufacture of detectors for graphical presentation with the use of ionizing radiation for medical applications and for NDT (Non-Destructive Testing), scintillators—for example CsI:TI on Al substrates or GOS (Gadolinium oxysulfide=$Gd_2O_2S$) intensifier foils—are arranged over photosensors such as CMOS arrays (CMOS=Complementary Metal Oxide Semiconductor) or CCD arrays (CCD=Charge Coupled Device=light-sensitive electronic component), in particular with amorphous silicon (a-Si) technology. The scintillator layer is either only pressed on or is glued. The gluing has the advantage that more light is injected from the scintillator into the photosensor.

A production method, a scintillator-photosensor sandwich and a radiation detector are known from the publication US 2008/0206917 A1. Disclosed in this publication is a production process of such a scintillator-photosensor sandwich for use in a radiation detector for ionizing radiation within the scope of a graphical presentation, in which process an adhesive layer is laminated onto a photosensor layer without vacuum with the aid of a transfer adhesive tape, wherein the remaining protective film of the transfer adhesive tape is removed from the adhesive layer in the processing process immediately following the lamination process, and the scintillator layer is thereupon placed on the photosensor layer provided with an adhesive layer and glued with this.

It is problematic that this known work process is expensive, particularly due to the fact that the production process is implemented in part under vacuum.

SUMMARY OF THE INVENTION

An object of the invention to find an alternative production method for an x-ray detector or an x-ray detector element in which the combination of scintillator layer and photosensor layer is produced more simply and securely.

According to the invention, for example, the production of a scintillator-photosensor sandwich for a detector takes place in three steps by means of a transfer adhesive tape comprising a layer structure of protective film—adhesive layer—optional protective film. In a first step the remaining adhesive film with adhesive layer is laminated onto a support substrate after remaining the possibly present lower protective film, which support substrate is larger than the scintillator or photosensor. In a second step, the frame with the film is placed over the scintillator or the photosensor and the adhesive film is laminated onto or brought into contact with this, wherein in this case the frame serves as a vacuum vessel. According to the invention, the vacuum is generated in the volume (enclosed by the frame and film) via a perforated floor which simultaneously draws up and levels the scintillator or photosensor. After removing the second protective film from the framed scintillator or, respectively, photosensor, a second frame is glued onto this frame, which second frame is then placed over the photosensor or, respectively, the scintillator and either is laminated again or contacted (advantageously under vacuum). The cutting of the frame from the scintillator/adhesive film/photosensor package takes place later. However, the frame can also be removed after the first gluing step and then be laminated onto the respective counterpart—thus the scintillator or, respectively, the photosensor. It is also possible to laminate the scintillator and the photosensor in one processing step via initial gluing onto the frame and removal of the second protective film.

A marked simplification compared to the prior art results in the described vacuum solutions, due to the frame. It is therefore also possible to simply produce both adhesive connections under vacuum (to avoid air inclusions). Given lamination the frame offers the possibility to adhere both function layers to be combined in one work step. It is an additional advantage that a closed small space can be achieved, and advantageously the adhesive side (without the removed protective film) is always directed downward. The possibility of interfering particle inclusions on the function layer is thus markedly reduced.

A scintillator layer as used herein means a combination of a substrate with a scintillator material (CsI:TI) deposited on it. A photosensor layer as used herein means any layer structure that generates electronic signals per pixel from optical signals. Both layers are herein designated with the term "function layer", such a layer performs either the function of the conversion of ionization radiation into light pulses or the function of registering these light pulses.

In a method to produce a scintillator-photosensor sandwich for use in a pixel-resolving radiation detector for ionizing radiation, either a scintillator layer or photosensor layer can be a first function layer and the other is then a second function layer, and at least the following method steps are implemented.

A first support frame is glued onto an adhesive layer (covered on at least one side with a second protective film) on the side of the adhesive layer, and the first frame has a size that (in terms of area) that surrounds the scintillator-photosensor sandwich to be produced.

The first support frame is placed onto a flat base bearing a first function layer, laminar assembly of the adhesive layer spanned on the first support frame and the first function layer.

The second protective film is removed from the adhesive layer.

The second function layer is assembled with the first function layer with the interposed adhesive layer.

The production method is significantly simplified by this use of a support frame in the connection to the at least one side of the adhesive layer with a function layer. In particular, it is advantageous that the adhesive layer is directed downward upon application of the function layer, so there is a significantly smaller likelihood of contamination of the sensor surface.

Instead of a two-layer transfer adhesive tape having a single protective film and an adhesive layer located thereon, a three-layer transfer adhesive tape can also advantageously be used in which the adhesive layer is embedded like a sandwich between two protective films. In the method according to the invention it is then necessary that a first protective film is removed from the adhesive layer just before the gluing of the first support frame.

Furthermore, the laminar assembly of the adhesive layer and the first function layer can, for example, be executed by rolling or scraping the second protective film across with the underlying adhesive layer.

However, it is more advantageous if the laminar assembly of the adhesive layer and the first function layer occurs under vacuum, at least in the region between the adhesive layer and the first function layer.

According to the invention, by the use of a support frame the advantageous possibility thereby results that the first support frame is placed with its free side onto a sealed surface of a support and over the first function layer, such that the adhesive layer does not contact the first function layer, wherein a sealed space is achieved and a vacuum is subsequently generated below the first support frame. For example, the vacuum can be generated in the region of the sealed space via the extraction of air through openings in the surface of the support. Alternatively, it is also possible to provide the frame itself together with a connection to a vacuum-generating device, no special measures are necessary with regard to the work surface on which the entire manufacturing process takes place.

The method according to the invention can also be extended by, after removing the second protective film from the adhesive layer on the uncovered side of said adhesive layer opposite the first support frame, gluing a second support frame onto the adhesive layer.

This second support frame can then likewise be placed with its free side on a sealed surface of the support and over the second function layer, such that the adhesive layer does not directly contact the second function layer, wherein a newly sealed space is achieved in turn and a vacuum is subsequently generated in the newly sealed space. This vacuum can also in turn be implemented via removal of air from the sealed space, for example via the placement surface for the second support frame or even via a corresponding vacuum connection to the support frame itself.

After the gluing of the function layers, the support frame or, respectively, frame(s)—including the overlaid adhesive layer—can be separated from the scintillator-photosensor sandwich so that only the scintillator-photosensor sandwich remains as a product to be manufactured.

If two support frames are used in the manufacturing process, it is advantageous if these support frames are designed with regard to their size so that they are congruent in the projection of their areal extent. Moreover, support frames which are rectangular or square or, respectively, elliptical or round in shape in projection can advantageously be used.

At least one support frame that is used can be at least partially elastic or flexible in terms of its height so that, as soon as a vacuum is applied within the support frame, the height is reduced due to the arising pressure difference, and therefore the adhesive layer attached to the support frame automatically comes to rest on the underlying function layer to be glued.

The invention also encompasses a scintillator-photosensor sandwich generated according to this described manufacturing method.

The invention also encompasses a radiation detector for ionizing radiation for imaging examination methods is claimed that includes at least one scintillator-photosensor sandwich produced according to the described manufacturing method.

BRIEF DESCRIPTION OF THE DRAWINGS

FIGS. 1a, 1b through FIGS. 9a, 9b respectfully show workflow steps in the production method according to the invention, wherein figures designated with "a" show an overview and figures designated with "b" show a side view of the respective method step.

DESCRIPTION OF THE PREFERRED EMBODIMENTS

Figure 4A:
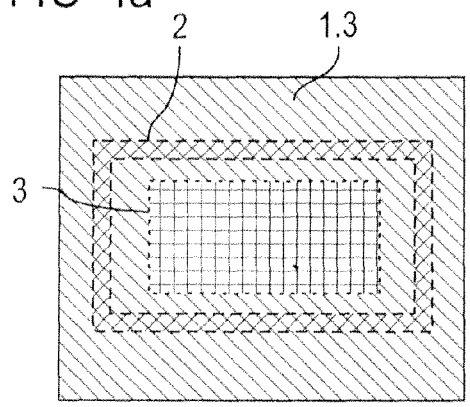

In the following the invention is described in detail in the figures, wherein only the features necessary to understand the invention are shown. The following reference characters are used: 1: transfer adhesive tape; 1.1: first protective film; 1.2: adhesive layer; 1.3: second protective film; 2: first support frame; 3: first function layer; 4: vacuum connections; 5: vacuum pump; 6: second support frame; 7: second function layer; 8: scintillator-photosensor sandwich; 9: support.

A preferred embodiment of the method according to the invention is shown in FIGS. 1a, 1b through 9a, 9b. FIGS. 1a through 9a respectively show an overview while FIGS. 1b through 9b respectively show a side view.

A transfer adhesive tape 1 is shown in FIGS. 1a and 1b, in which an adhesive layer 1.2 is covered on both sides by two protective films 1.1 and 1.3. Assuming such an adhesive tape 1, in FIGS. 2a and 2b it is shown how the first protective film 1.1 is lifted from the adhesive layer 1.2 while the protective film 1.3 continues to remain on the adhesive layer 1.2.

FIGS. 3a and 3b now show a first support frame 2 placed on the adhesive layer 1.2, which support frame 2 ensures that the remaining transfer adhesive tape (comprising the adhesive layer 1.2 and the second protective film 1.3) always remains in a defined extended alignment in the further processing.

Figure 4B:
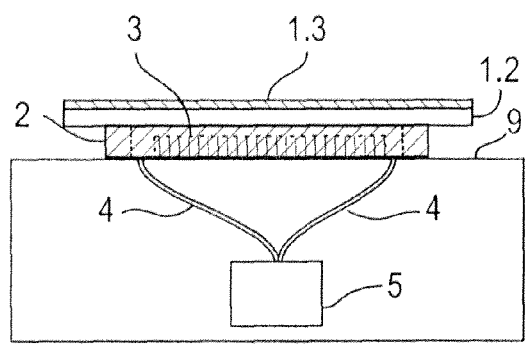

After gluing the first support frame 2, the entire formation (comprising the first support frame 2, the adhesive layer 1.2 located on this, and the protective film 1.3) can be turned by 180° and—as is shown in FIGS. 4a and 4b—drawn over a function layer 3, wherein the support frame seals air-tight with the placement surface, and the adhesive layer 1.2 stretched across the support frame does not directly touch the surface of the function layer 3. If a vacuum is now generated (via corresponding vacuum lines 4 that are connected with a vacuum pump) within the space bounded by the support frame, the adhesive layer 1.2 lowers slightly onto the surface of the function layer 3 and enters into a firm connection with this.

Figure 5A:
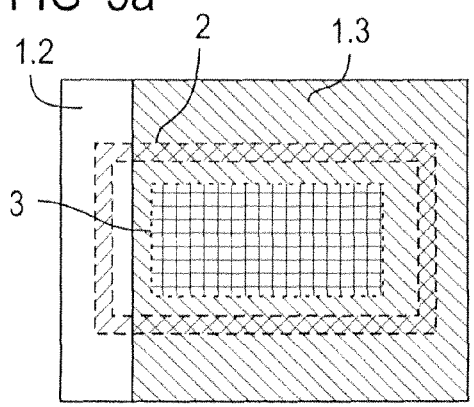
Figure 5B:
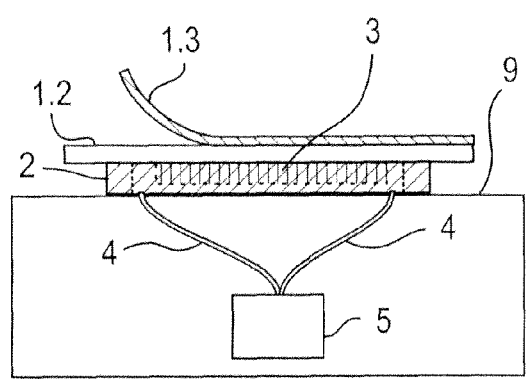
Figure 6A:
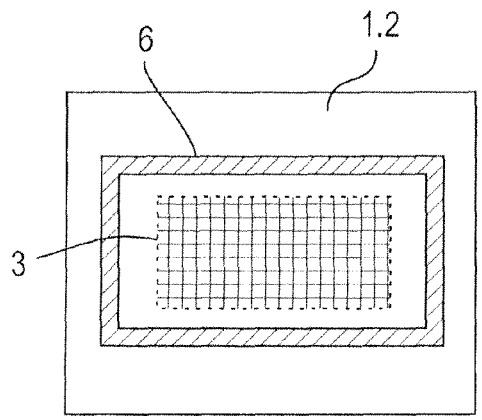
Figure 6B:
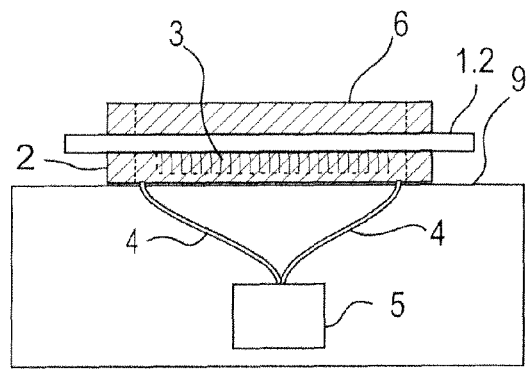
Figure 7A:
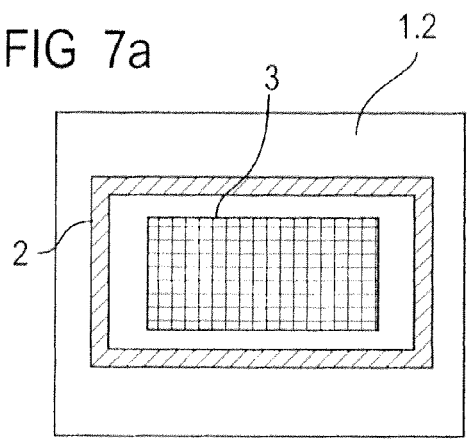
Figure 7B:
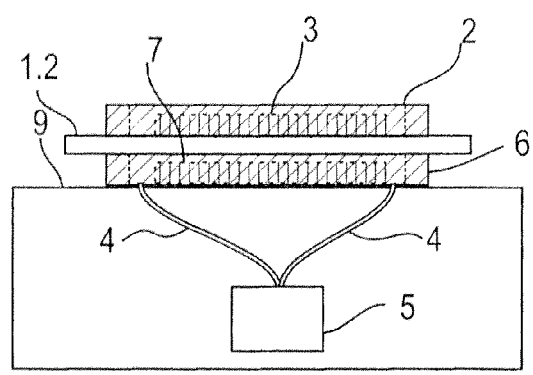

It is apparent in FIGS. 5a and 5b that the first function layer 3 already adheres to the adhesive layer 1.2. After this adhesion has occurred, the second protective film 1.3 can now be removed from the adhesive layer 1.2. A second support frame 6 is now applied onto the side of the adhesive layer 1.2 from which the second protective film 1.3 was removed, as shown in FIGS. 6a and 6b, and then the entire formation is turned with the two congruently arranged support frames and is placed over the second function layer 7. This situation is shown in FIGS. 7a and 7b. A vacuum is subsequently generated again within the second support frame 6, via which the adhesive surface is again placed on the surface of the second function layer 7 and a fixed connection between the function layer 7 and the adhesive layer 1.2 is therefore generated.

Figure 8A:
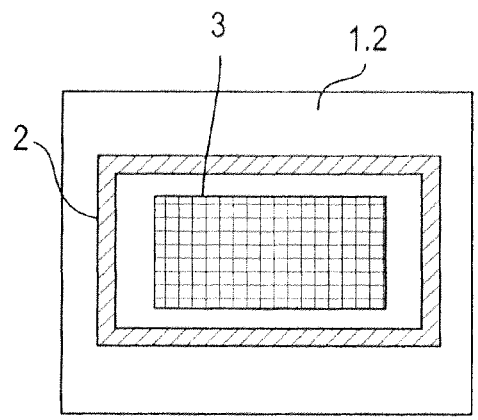
Figure 8B:
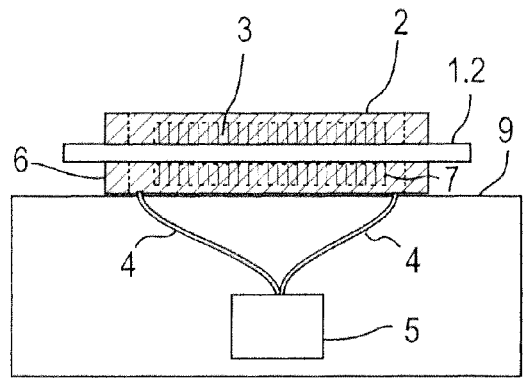

Finally, the complete combination between the adhesive layer 1.2 and the support frames 2 and 6 (including the function layers 3 and 7 glued onto the adhesive layer 1.2) is shown in FIGS. 8a and 8b.

Figure 9A:
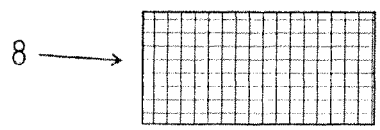
Figure 9B:
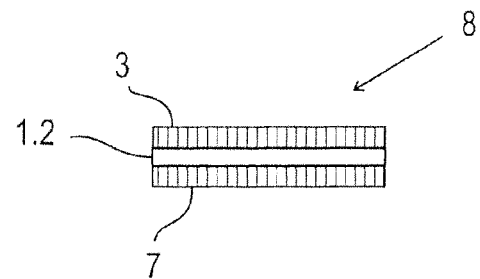

Ultimately, the adhesive layer 1.2 projecting beyond the function layers can be truncated with the support frames 2 and 6 connected with this, such that the sandwich 8 shown in FIGS. 9a and 9b is created that comprises a first function layer 3 with a following adhesive layer 1.2 and a second function layer 7.

According to the invention, a scintillator layer or a photosensor layer can selectively be used as a first function layer, and a photosensor layer or, respectively, a scintillator layer can be used as a second function layer, such that ultimately a scintillator-photosensor sandwich 8 is produced as shown in FIG. 9*b*.

Overall, thus proposed with the invention are a method to produce a scintillator-photosensor sandwich, a scintillator-photosensor sandwich, and a radiation detector with such a scintillator-photosensor sandwich, in which the scintillator-photosensor sandwich is generated by gluing of a first support frame onto an adhesive layer covered on at least one side with an a second protective film on the other side of side adhesive layer, followed by placement of the first support frame on a flat support bearing a first function layer, and laminar assembly of the adhesive layer tensioned on the first support frame and the first function layer, followed by removal of the second protective film from the adhesive layer; and assembly of the second function layer with the first function layer, with the interposed adhesive layer.

Although modifications and changes may be suggested by those skilled in the art, it is the intention of the inventor to embody within the patent warranted hereon all changes and modifications as reasonably and properly come within the scope of his contribution to the art.

We claim as our invention:

1. A method to produce a scintillator-photosensor sandwich for a pixel-resolving radiation detector for ionizing radiation, comprising the steps of:
   gluing a support frame onto a first side of an adhesive layer, said adhesive layer having a second side covered with a protective film, said support frame having a size in terms of area that surrounds a scintillator-photosensor sandwich to be produced;
   placing the support frame onto a flat base that supports a first function layer, selected from the group consisting of a scintillator layer and a photosensor layer;
   laminarly assembling said adhesive layer supported on said support frame and said first function layer;
   removing said protective film from said adhesive layer; and
   assembling a second function layer, which is the scintillator layer or photosensor layer not selected as said first function layer, with said first function layer with the adhesive layer interposed therebetween, thereby producing a scintillator-photosensor sandwich comprised of said first function layer, said second function layer and said adhesive layer therebetween.

2. A method as claimed in claim 1 comprising providing said adhesive layer with a further protective film on said first side of said adhesive layer, and removing said further protective film from said first side of said adhesive layer before gluing to said support frame.

3. A method as claimed in claim 1 comprising laminarly assembling said adhesive layer and said first function layer by rolling or scraping over said protective film with the adhesive layer underlying said protective film.

4. A method as claimed in claim 1 comprising laminarly assembling said adhesive layer and said first function layer under a vacuum, at least in a region between said adhesive layer and said first function layer.

5. A method as claimed in claim 4 comprising placing a free side of said support frame, opposite said side of said support frame on which said adhesive layer is glued, on a sealed surface of a support over said first function layer, with said adhesive layer not contacting said first function layer, thereby producing a sealed volume, and generating said vacuum below said first support frame.

6. A method as claimed in claim 5 comprising generating said vacuum by removing air through openings in a surface of said support in a region of said sealed space.

7. A method as claimed in claim 5 comprising generating said vacuum by connecting said support frame directly to a vacuum-generating device.

8. A method as claimed in claim 5 wherein said support frame is a first support frame, and comprising, after removing said protective film from said adhesive layer, gluing a second support frame onto said adhesive layer at said second side of said adhesive layer, opposite said first support frame.

9. A method as claimed in claim 8 comprising rotating said scintillator-photosensor sandwich, with said second support frame glued to said second side of said adhesive layer, so as to place a free side of said second support frame, opposite to the side thereof at which said adhesive layer is glued, onto said sealed surface of said support over said second function layer, with said adhesive layer not contacting said second function layer, thereby producing a further sealed volume, and generating a vacuum in said further sealed volume.

10. A method as claimed in claim 9 comprising generating said vacuum in said further sealed volume by removing air from within said further sealed volume.

11. A method as claimed in claim 8 comprising removing said first and second support frames from said scintillator-photosensor sandwich, and removing any adhesive layer that projects from said scintillator-photosensor sandwich.

12. A method as claimed in claim 8 wherein said first and second support frames are of equal size and are placed congruently with respect to each other.

13. A method as claimed in claim 12 wherein said first and second support frames each have a shape selected from the group consisting of rectangles, squares, circles and ellipses, in a plane parallel to said photosensor-scintillator sandwich.

14. A method as claimed in claim 8 wherein at least one of said first and second support frames is at least partially comprised of material that is elastic in a height direction proceeding substantially perpendicularly to said photosensor-scintillator sandwich.

15. A method as claimed in claim 1 comprising removing said support frame from said scintillator-photosensor sandwich, and any adhesive layer projecting beyond said scintillator-photosensor sandwich.

16. A method as claimed in claim 1 wherein said support frame has a shape selected from the group consisting of rectangles, squares, circles and ellipses, in a plane parallel to said scintillator-photosensor sandwich.

17. A method as claimed in claim 1 wherein said support frame is comprised of material that is at least partially elastic in a height direction of said support frame, substantially perpendicular to said scintillator-photosensor sandwich.

* * * * *